(12) United States Patent
Chang

(10) Patent No.: US 7,778,059 B2
(45) Date of Patent: Aug. 17, 2010

(54) PHASE CHANGE MEMORY DEVICE HAVING A UNIFORM SET AND RESET CURRENT

(75) Inventor: Heon Yong Chang, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 311 days.

(21) Appl. No.: 11/854,772

(22) Filed: Sep. 13, 2007

(65) Prior Publication Data

US 2008/0117668 A1    May 22, 2008

(30) Foreign Application Priority Data

Nov. 16, 2006    (KR) .................... 10-2006-0113469

(51) Int. Cl.
  *G11C 5/06* (2006.01)
(52) U.S. Cl. .................... 365/63; 365/51; 365/163
(58) Field of Classification Search ................ 365/163, 365/63, 51
  See application file for complete search history.

(56) References Cited

U.S. PATENT DOCUMENTS 5,616,950 A * 4/1997 Liu .......................... 257/469

6,812,540 B2 * 11/2004 Takaura et al. ............. 257/510

FOREIGN PATENT DOCUMENTS

| JP | 2003-110033 A | 4/2003 |
|----|---------------|--------|
| JP | 2004-319200 A | 11/2004 |
| KR | 10-0686630 A | 2/2000 |
| KR | 1020060075423 A | 7/2006 |

* cited by examiner

*Primary Examiner*—Hoai V Ho
*Assistant Examiner*—Kretelia Graham
(74) *Attorney, Agent, or Firm*—Ladas & Parry LLP

(57) ABSTRACT

A phase change memory device having a uniform set and reset current includes a first and second sense amplifiers that are respectively placed adjacent to both ends of a plurality of active regions. The active regions include a first active region and a second active region. The first active region has a first area having a first width, a second area having a second width greater than the first width, and a third area having a third width greater than the second width and are sequentially arranged in a direction extending toward an area adjacent to the first sense amplifier. The second active region has a first area having a first width, a second area having a second width greater than the first width, and a third area having a third width greater than the second width, which are sequentially arranged in a direction extending toward an area adjacent to the second sense amplifier.

5 Claims, 6 Drawing Sheets

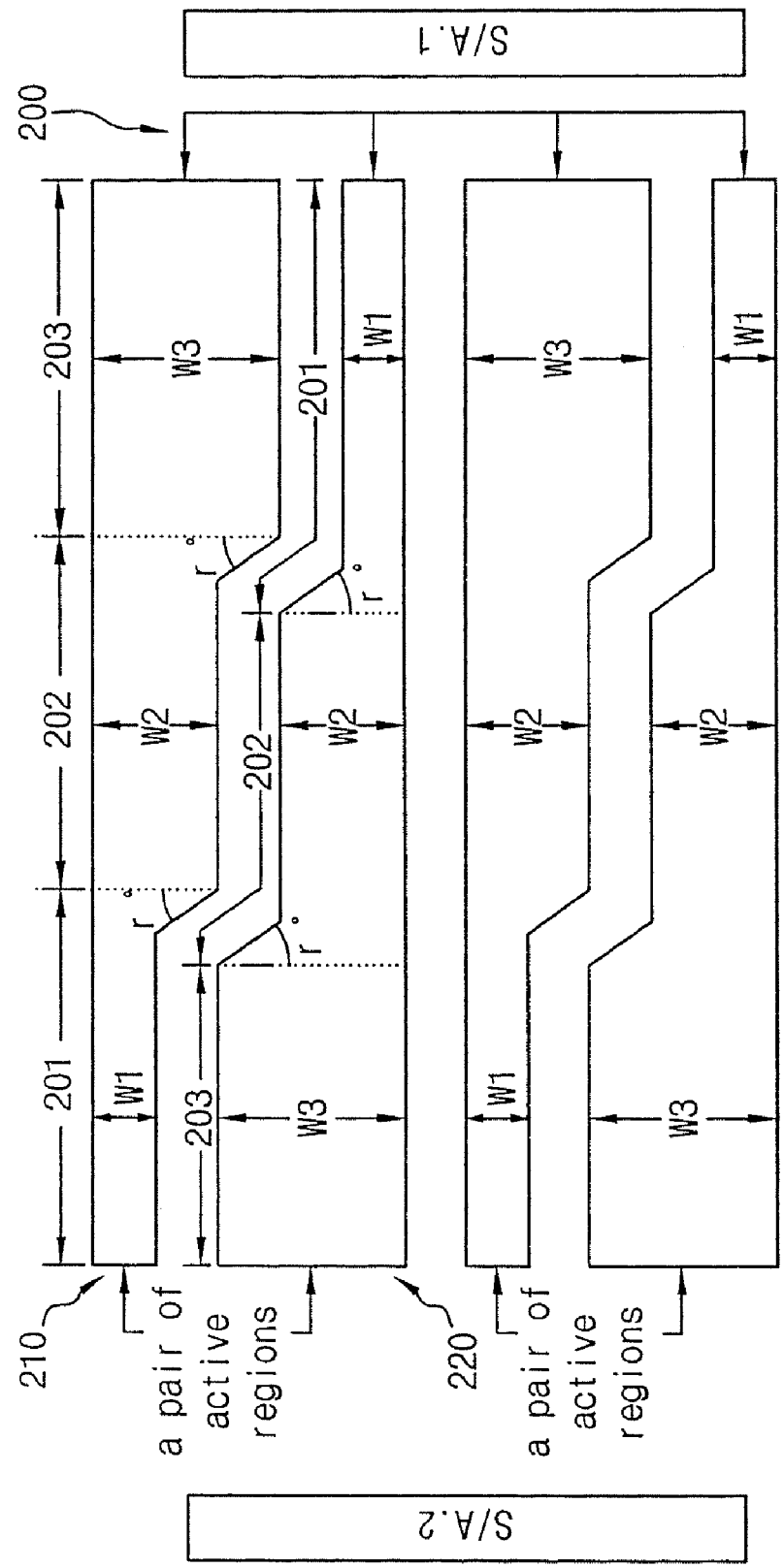

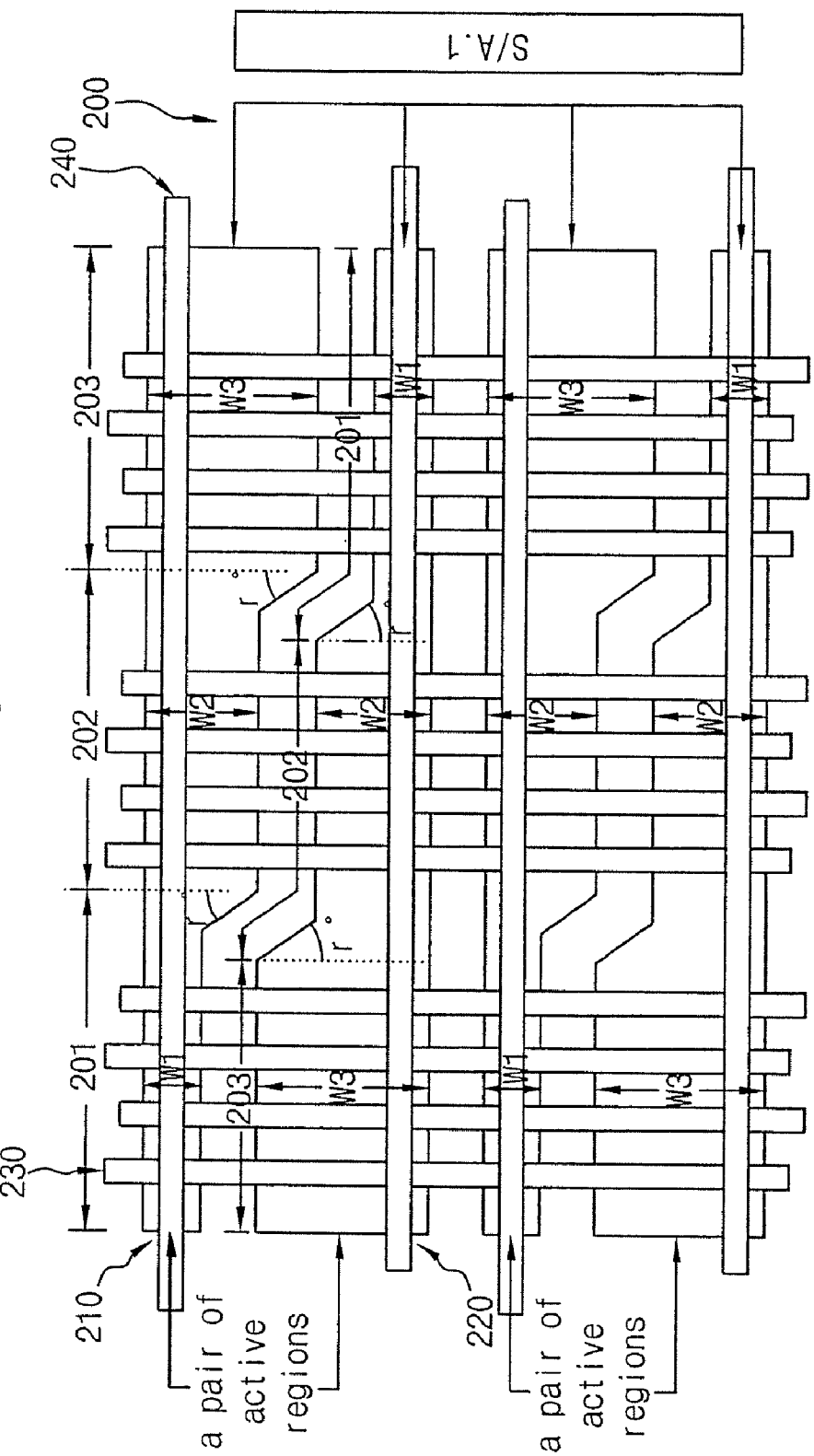

PHASE CHANGE MEMORY DEVICE HAVING A UNIFORM SET AND RESET CURRENT

CROSS-REFERENCE TO RELATED APPLICATIONS

The present application claims priority to Korean patent application number 10-2006-0113469 filed on Nov. 16, 2006, which is incorporated herein by reference in its entirety.

BACKGROUND OF THE INVENTION

The present invention relates to a phase change memory device, and more particularly, to a phase change memory device that allows a plurality of memory cells of a memory array to be programmed with the same reset current and the same set current.

In general, memory devices are largely categorized as a volatile RAM (random access memory) that loses stored information when power is interrupted and a non-volatile ROM (read-only memory) that can continuously maintain the stored state of information even when power is interrupted. Volatile RAM includes memory such as DRAM (dynamic RAM) and SRAM (static RAM) whereas non-volatile ROM includes a flash memory device such as an EEPROM (electrically erasable and programmable ROM) can be mentioned.

As is well known in the art, although the DRAM is an excellent memory device, the DRAM must have a high charge storing capacity. To this end, since the surface area of an electrode must be increased, it is difficult to obtain a high integration level. Further, in a flash memory device, a high operation voltage is required when compared to a source voltage due to the fact that two gates are stacked on each other. Accordingly, since a separate booster circuit is needed to form the voltage necessary for write and delete operations, it is difficult to accomplish a high integration level.

Due to these limitations, research to develop a novel memory device having a simple configuration capable of accomplishing a high level of integration while retaining the characteristics of a non-volatile memory device have been pursued. For example, recently, a phase change memory device has been disclosed in the art.

The phase change memory device is based on the fact that a phase change occurs in a phase change layer interposed between a lower electrode and an upper electrode from a crystalline state to an amorphous state due to current flow between the lower electrode and the upper electrode. The information stored in a cell is recognized by the medium of a difference in resistance between the crystalline state and the amorphous state.

The phase change memory device includes a chalcogenide layer which is a compound layer made of germanium (Ge), stibium (Sb) and tellurium (Te) that is employed as a phase change layer. As a current is applied, the phase change layer undergoes a phase change between the amorphous state and the crystalline state due to heat, specifically Joule heat. Accordingly, in the phase change memory device, the specific resistance of the phase change layer in the amorphous state is higher than the specific resistance of the phase change layer in the crystalline state. Considering this fact, in a read mode, sensing the current flowing through the phase change layer determines whether the information stored in the phase change cell has a logic value of '1' or '0'.

Meanwhile, in a memory array having a plurality of memory cells, the parasitic loadings of the respective memory cells can be different from one another according to the locations of the memory cells in the memory array. The parasitic loadings induce differences in the reset currents of the memory cells as the area of the memory array increases. These differences in the reset currents may also cause differences in set currents.

Due to the differences in set currents, all the memory cells cannot be uniformly set by one set current. That is to say, while some of the memory cells transition to a set state by the set current, other memory cells can be in a reset state. Even where some of the memory cells transition to the set state, the values of set resistances can be different from one another.

FIG. 1 is a graph illustrating a relationship between the current applied to phase change cells and the resistances of the phase change cells in a conventional phase change memory device.

Referring to FIG. 1, respective memory cells have different reset and set current curves. The first cell has a high set current, the second cell has an intermediate set current, and the third cell has a low set current.

If the current corresponding to a voltage level (V) is applied to the respective cells, the second cell and the third cell transition to reset resistance states. The values of the reset resistances of the second and third cells are also different from each other.

Therefore, as described above, in a plurality of memory arrays, the amount of set current for transitioning the phase change cells to a set state may vary in respective memory cells. Thus, all the memory cells may not transition to the set state by one set is current.

The differences in the amount of set current for the memory cells are generally observed between the cell (a first cell) closest to a sense amplifier and the cell farthest from the sense amplifier (an $n^{th}$ cell). In the case of the first cell, the first cell can be over-programmed when compared to the $n^{th}$ cell, and in the case of the $n^{th}$ cell, the $n^{th}$ cell may not be programmed.

SUMMARY OF THE INVENTION

Embodiments of the present invention are directed to a phase change memory device that allows a plurality of memory cells of a memory array to be programmed with the same reset current and the same set current.

In one embodiment of the present invention, a phase change memory device comprises a semiconductor substrate having a plurality of active regions which extend in one direction and are arranged in another direction; a plurality of word lines formed on the active regions to extend in another direction; source areas and drain areas formed in the active regions on both sides of the word lines; a plurality of phase change cells formed to contact the source areas, and the phase change cells including lower electrodes, phase change layers and upper electrodes; a plurality of bit lines arranged to extend in one direction which is perpendicular to the word lines, and formed to contact the upper electrodes of the phase change cells; and sense amplifiers connected with the bit lines, wherein the sense amplifiers include a first sense amplifier and a second sense amplifier which are respectively placed adjacent to one end and the other end of the active regions, wherein the bit lines include first bit lines which are connected with the first sense amplifier and second bit lines which are connected with the second sense amplifier, and the first and second bit lines are alternately arranged with each other, and wherein the active regions include a first active region and a second active region, the first active region has a first area having a first width, a second area having a second width greater than the first width, and a third area having a third width greater than the second width, which are sequentially arranged in a direction extending toward an area adjacent to the first sense amplifier, and the second active region has a first area having a first width, a second area having a second width greater than the first width, and a third area having a third width greater than the second width, which are sequentially arranged in a direction extending toward an area adjacent to the second sense amplifier.

A border area between the first area and the second area and a border area between the second area and the third area are sequentially arranged while having an acute angle.

A border area between the first area and the second area and a border area between the second area and the third area are sequentially arranged while having a right angle.

Each of the first active region and the second active region has a structure in which a plurality of areas having widths greater than the third width are sequentially arranged with one another.

The first area, the second area and the third area are sequentially arranged while being separated from one another.

BRIEF DESCRIPTION OF THE DRAWINGS

FIGS. 2A through 2C are plan views explaining a phase change memory device in accordance with an embodiment of the present invention.

DESCRIPTION OF SPECIFIC EMBODIMENTS

In an embodiment of the present invention, all the memory cells of a memory array can be programmed with the same set current and the same reset current by differentiating the channel widths of cells between a channel length and a channel width that determine the current amount of a transistor. In other words, in an embodiment of the present invention, a near cell (corresponding to a first region), which is close to a sense amplifier, has a decreased width of a transistor, a medium cell (corresponding to a second region), which is intermediately positioned, has an average width of a transistor, and a far cell (corresponding to a third region), which is distant from the sense amplifier, has an increased width of a transistor.

As a result, in the phase change memory device according to an embodiment of the present invention, since the current amounts applied to a phase change material by one set current or reset current are the same, the parasitic loading of the far cell which is distant from the sense amplifier is compensated for and therefore the same set resistance and the same reset resistance can be accomplished.

Figure 1:
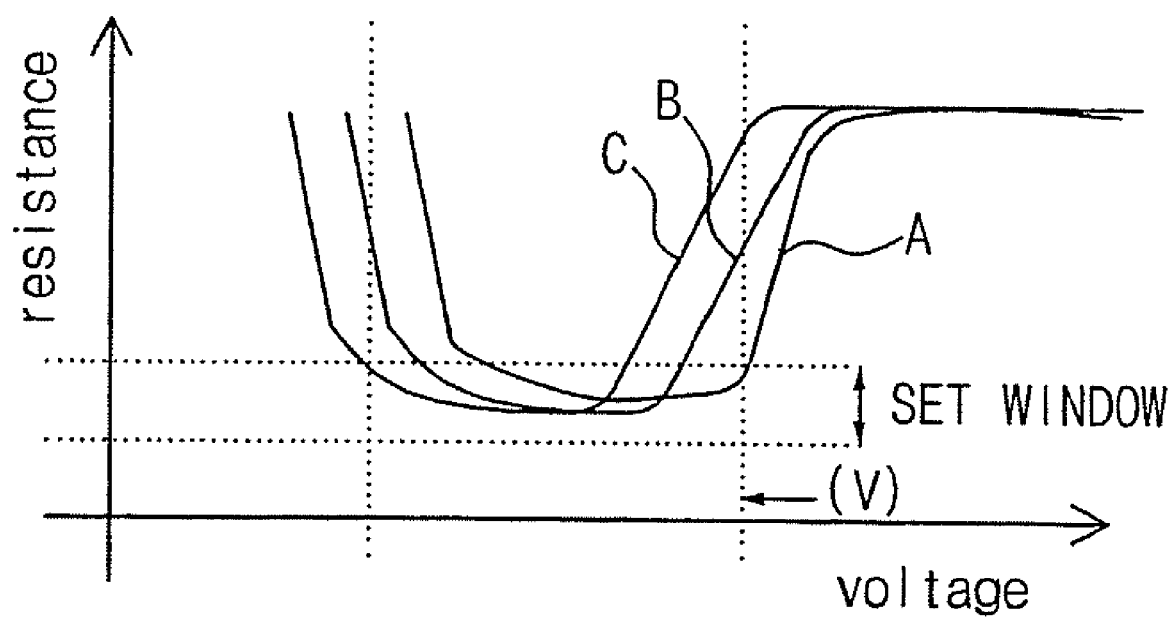
FIG. 1 is a graph illustrating a relationship between the current applied to phase change cells and the resistances of the phase change cells in a conventional phase change memory device.
Figure 2B:
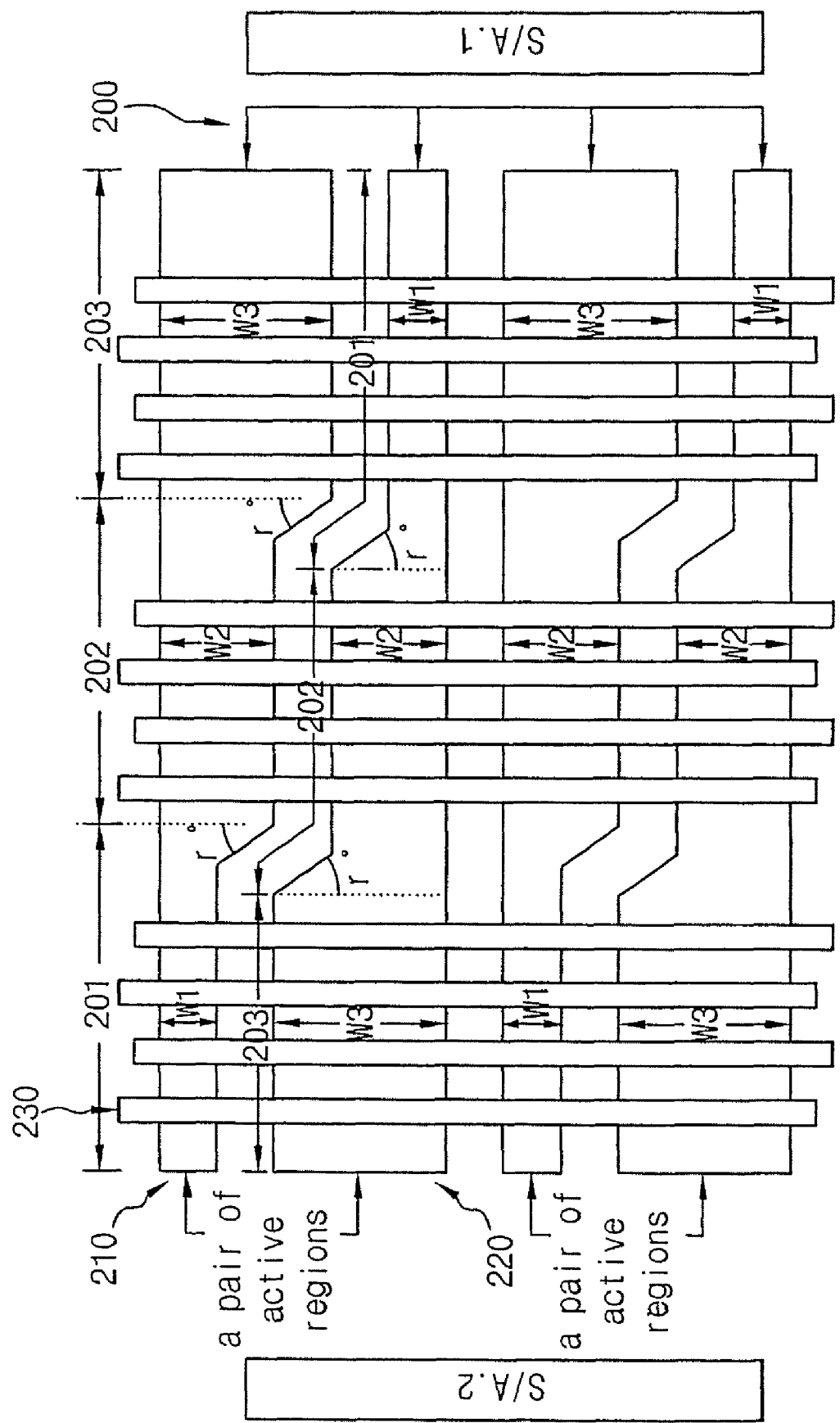

In detail, FIGS. 2A through 2C are plan views explaining a phase change memory device in accordance with an embodiment of the present invention.

Referring to FIG. 2A, a semiconductor substrate is formed to have a plurality of active regions 200, in which each active region 200 extends in one direction while the plurality of the active regions 200 are arranged in another direction. The plurality of active regions 200 include a first active region 210 and a second active region 220. In the first active region 210, a first area 201 having a first width W1, a second area 202 having a second width W2 that is greater than the first width W1, and a third area 203 having a third width W3 that is greater than the second width W2 are sequentially arranged. The second active region 220 has a shape corresponding to that of the first active region 210. In the second active region 220, a first area 201, a second area 202 and a third area 203 are sequentially arranged in a reverse order in relation to the first active region 210. The surfaces of the first and second active regions 210 and 220 that face away from each other have a straight-line sectional shape. The pair of first and second active regions 210 and 220, which face each other, are formed in a plural number.

The first active region 210 and the second active region 220 are formed such that the border area between the first area 201 and the second area 202 has an acute angle r°. The border area between the second area 202 and the third area 203 also has acute angle r°. The border areas between first and second active regions 201 and 202, respectively, and second and third active regions 202 and 203, respectively are sequentially arranged. A first sense amplifier S/A.1 and a second sense amplifier S/A.2 are placed adjacent to opposite ends of the active regions 200. The first sense amplifier S/A.1 is placed adjacent to the first active region 210 and the second sense amplifier S/A.2 is placed adjacent to the second active region 220.

Therefore, the first active region 210 has a structure in which the first area 201, the second area 202 and the third area 203 are sequentially arranged in a direction extending toward the area adjacent to the first sense amplifier S/A.1. Also, the second active region 220 has a structure in which the first area 201, the second area 202 and the third area 203 are sequentially arranged in a direction extending toward the area adjacent to the second sense amplifier S/A.2.

Meanwhile, although not shown in the drawings, each of the first active regions 210 and the second active regions 220 can have a structure in which a plurality of areas having widths greater than the third width W3 are sequentially arranged.

In an embodiment of the present invention, where the first area (a near cell) 201, the second area (a medium cell) 202 and the third area (a far cell) 203 are formed to have different widths in the direction extending toward the area adjacent to the sense amplifier, all cells can be programmed with the same set current and same reset current by varying the width of a transistor which determines the current amount of the transistor.

In other words, the first active region 210 adjoining the first sense amplifier S/A.1 is formed to have a structure in which the first area 201 having the first width W1, the second area 202 having the second width W2 that is greater than the first width W1, and the third area 203 having the third width W3 that is greater than the second width W2 are sequentially arranged in a direction extending towards the first sense amplifier S/A.1. The second active region 220 adjoining the second sense amplifier S/A.2 has a shape corresponding to that of the first active region 210 and is formed to have a structure in which the first area 201, the second area 202 and the third area 203 are sequentially arranged in a direction extending towards the second sense amplifier S/A.2. Since the current amounts applied to a subsequently formed phase change material by one set current or reset current becomes uniformly the same, the parasitic loadings owned by the third areas (the far cells) 203 which are most distant from the first and second sense amplifiers s/A.1 and S/A.2 is compensated for, whereby a sensing margin can be increased.

Referring to FIG. 2B, a plurality of word lines 230 are formed on the active regions extending in a direction perpendicular to the active regions. A transistor is configured by forming a source area and a drain area (not shown) on both sides of each word line 230.

While not shown in detail in the drawings, a plurality of phase change cells including lower electrodes, phase change layers, and upper electrodes are formed to come into contact with respective source areas.

Referring to FIG. 2C, a plurality of bit lines 240 are formed to extend in one direction perpendicular to the word lines 230 and to contact the upper electrodes of the phase change cells.

Figure 3:
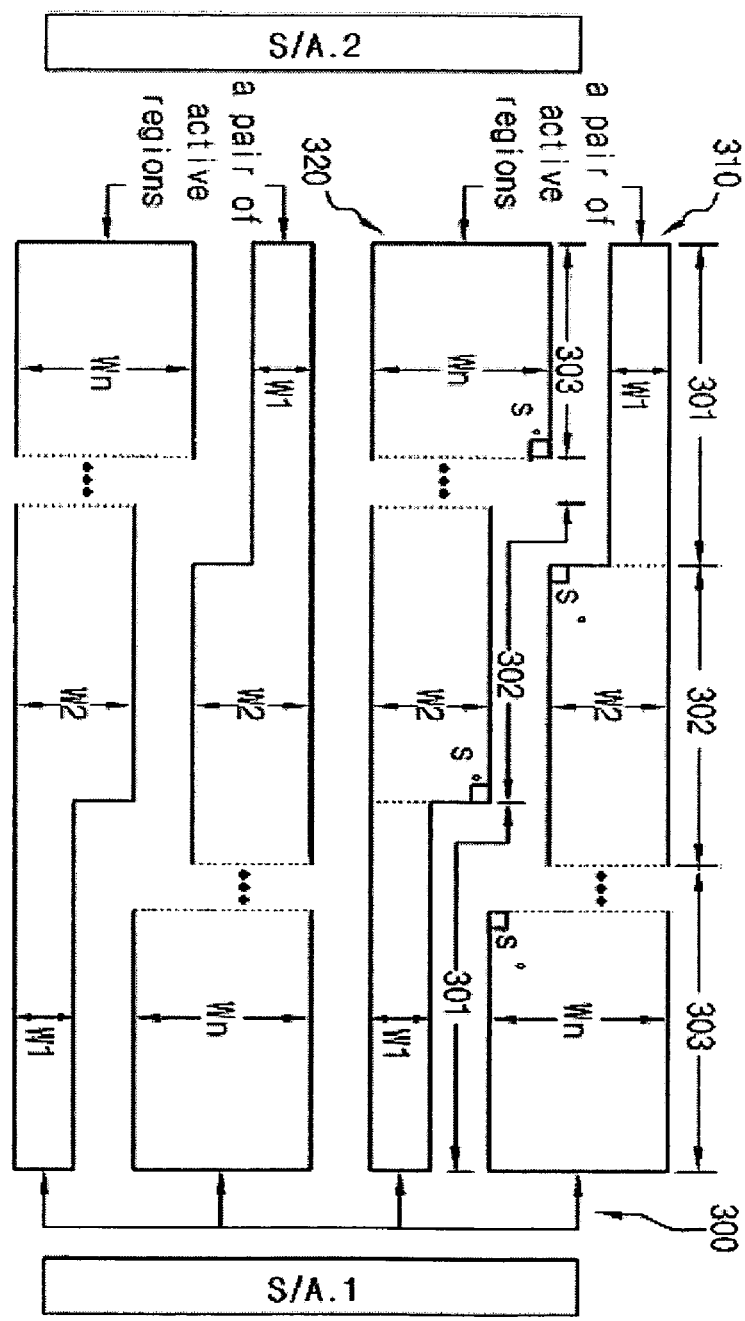
FIG. 3 is a plan view explaining a phase change memory device in accordance with another embodiment of the present invention.

In the above-described embodiment, the active region is formed in a manner such that the border area between the first area 201 and the second area 202 and the border area between the second area 202 and the third area 203 are sequentially arranged having an acute angle r°. However, in another embodiment of the present invention, as shown in FIG. 3, an active region can be formed in a manner such that the border area between a first area 301 and a second area 302 and the border area between the second area 302 and an $n^{th}$ area 303 having an $n^{th}$ width Wn are sequentially arranged having a right angle s°. In FIG. 3, reference numeral 310 designates a first active region and 320 a second active region.

Figure 4:
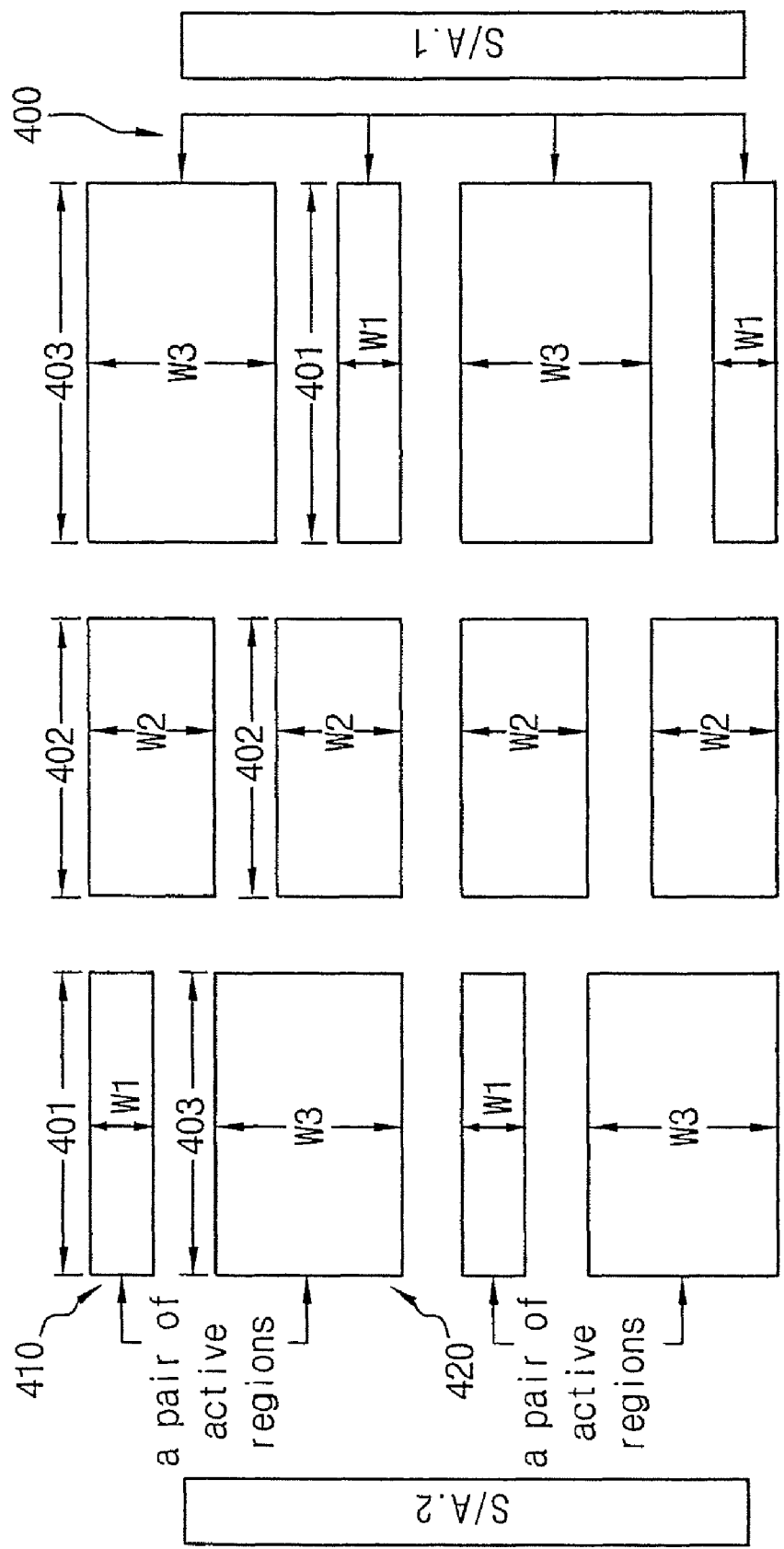
FIG. 4 is a plan view explaining a phase change memory device in accordance with still another embodiment of the present invention.

Also, in the above-described embodiment, the first area 201, the second area 202 and the third area 203 are sequentially arranged without being separated from one another. However, in still another embodiment of the present invention, as shown in FIG. 4, a first area 401, a second area 402 and a third area 403 of an active region can be formed in a manner such that they are sequentially arranged while being separated from one another. In FIG. 4, reference numeral 410 designates a first active region and 420 a second active region.

As is apparent from the above description, in the phase change memory device according to an embodiment of the present invention, where a length and a width determines the current amount of a transistor, the channel widths of transistors are differentiated. Namely, a near cell close to a sense amplifier, has a decreased width of a transistor, a medium cell, which is intermediately positioned, has an average width of a transistor, and a far cell, which is distant from the sense amplifier, has an increased width of a transistor. Therefore, all the cells can be programmed with the same set current and the same reset current.

As a result, in an embodiment of the present invention, the parasitic loading of the far cell that is distant from the sense amplifier is compensated and the same set resistance and the same reset resistance may be accomplished.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A phase change memory device comprising:
    a semiconductor substrate having a plurality of active regions, each of which extending in one direction, and the plurality of active regions being arranged in another direction;
    a plurality of word lines formed on the active regions to extend in another direction;
    a plurality of bit lines arranged to extend in one direction that is perpendicular to the word lines; and
    sense amplifiers connected with the bit lines,
    wherein the sense amplifiers include a first sense amplifier and a second sense amplifier placed adjacent a first end of the active regions and a second end of the active regions opposite the first end, respectively,
    wherein the bit lines include first bit lines which are connected with the first sense amplifier and second bit lines which are connected with the second sense amplifier,
    wherein the first and second bit lines are alternately arranged with each other, and
    wherein each of the active regions include a first active region and a second active region, the first active region has a first area having a first width, a second area having a second width greater than the first width, and a third area having a third width greater than the second width, which are sequentially arranged in a direction extending toward the first sense amplifier, and the second active region has a first area having a first width, a second area having a second width greater than the first width, and a third area having a third width greater than the second width, which are sequentially arranged in a direction extending toward the second sense amplifier.

2. The phase change memory device according to claim 1, wherein for each of the first active region and the second active region, a border area between the first area and the second area and a border area between the second area and the third area are sequentially arranged while having an acute angle.

3. The phase change memory device according to claim 1, wherein for each of the first active region and the second active region, a border area between the first area and the second area and a border area between the second area and the third area are sequentially arranged while having a right angle.

4. The phase change memory device according to claim 1, wherein when the first active region includes areas in addition to the first area, the second area, and the third area, a width of each of the additional areas will be greater than a previous area in the direction extending toward the first sense amplifier, and
    wherein when the second active region includes areas in addition to the first area, the second area, and the third area, a width of each of the additional areas will be greater than a previous area in the direction extending toward the second sense amplifier.

5. The phase change memory device according to claim 1, wherein for each of the first active region and the second active region, the first area, the second area and the third area are sequentially arranged while being separated from one another.

* * * * *